US010459299B2

(12) United States Patent
Cao

(10) Patent No.: US 10,459,299 B2
(45) Date of Patent: Oct. 29, 2019

(54) ESD PROTECTION UNIT, ARRAY SUBSTRATE, LCD PANEL AND DISPLAY DEVICE

(71) Applicant: BOE TECHNOLOGY GROUP CO., LTD., Beijing (CN)

(72) Inventor: Kun Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 31 days.

(21) Appl. No.: 15/239,100

(22) Filed: Aug. 17, 2016

(65) Prior Publication Data

US 2017/0131604 A1 May 11, 2017

(30) Foreign Application Priority Data

Nov. 5, 2015 (CN) .......................... 2015 1 0746641

(51) Int. Cl.
*G02F 1/1362* (2006.01)
*G02F 1/1343* (2006.01)
(Continued)

(52) U.S. Cl.
CPC ...... *G02F 1/136204* (2013.01); *G02F 1/1368* (2013.01); *G02F 1/134309* (2013.01); *G02F 1/136259* (2013.01); *H01L 27/0266* (2013.01); *H01L 27/0288* (2013.01); *H01L 27/0292* (2013.01); *H01L 27/1244* (2013.01); *H01L 27/1259* (2013.01); *G02F 1/136286* (2013.01);
(Continued)

(58) Field of Classification Search
CPC .......... G02F 1/136204; H01L 27/0266; H01L 27/0288; H01L 27/0292
See application file for complete search history.

(56) References Cited

U.S. PATENT DOCUMENTS 6,081,307 A * 6/2000 Ha ................... G02F 1/136204 349/40
2002/0101547 A1* 8/2002 Lee ................... G02F 1/136204 349/40
(Continued)

FOREIGN PATENT DOCUMENTS

CN 1707340 A 12/2005
CN 102929051 A 2/2013
(Continued)

OTHER PUBLICATIONS

US 5,767,928 A, 06/1998, Ha (withdrawn)
The First Chinese Office Action dated Nov. 30, 2017; Appln. No. 201510746641.6.

*Primary Examiner* — Michael H Caley
*Assistant Examiner* — Jonathan Y Jung

(57) ABSTRACT

An electro-static discharge (ESD) protection unit, an array substrate, a liquid crystal display panel and a display device. The ESD protection unit includes: a thin-film transistor (TFT); a first trace; and a second trace. A gate electrode of the TFT is exposed in a region that is formed by the first trace and the second trace and corresponds to a pixel unit, and the gate electrode of the TFT is configured to collect electric charges generated between the first trace and the second trace. A source electrode of the TFT is connected to the first trace and a drain electrode of the TFT is connected to the second trace.

9 Claims, 2 Drawing Sheets

(51) Int. Cl.
*G02F 1/1368* (2006.01)
*H01L 27/02* (2006.01)
*H01L 27/12* (2006.01)

(52) U.S. Cl.
CPC .............. *G02F 2001/13685* (2013.01); *G02F 2001/136263* (2013.01)

(56) References Cited

U.S. PATENT DOCUMENTS

| | | |
|---|---|---|
| 2003/0210359 A1 | 11/2003 | Lee et al. |
| 2005/0270454 A1* | 12/2005 | Ahn ................ G02F 1/133555 349/114 |
| 2007/0052647 A1* | 3/2007 | Chen .................... G09G 3/3233 345/92 |
| 2007/0058098 A1 | 3/2007 | Lo et al. |
| 2007/0273802 A1* | 11/2007 | Nakamura ........ G02F 1/136204 349/40 |

FOREIGN PATENT DOCUMENTS

| | | |
|---|---|---|
| TW | 440736 B | 6/2001 |
| TW | 200712599 A | 4/2007 |

* cited by examiner

ESD PROTECTION UNIT, ARRAY SUBSTRATE, LCD PANEL AND DISPLAY DEVICE

TECHNICAL FIELD

Embodiments of the disclosure relate to an Electro-Static Discharge (ESD) protection unit, an array substrate, a liquid crystal display (LCD) panel and a display device.

BACKGROUND

Currently, a fabrication process of a liquid crystal display panel mainly includes three processes: an array substrate fabrication process, a liquid crystal cell fabrication process and a module assembly process. In a fabrication process of an array substrate, during a procedure of transporting a glass substrate and fabricating Thin Film Transistors (TFT) thereon, the glass substrate is rubbed and moved constantly, leading to continuous generation of static electricity. Moreover, as the glass substrate is an insulator, the static electricity generated during the fabrication process of the array substrate is dispersed slowly. Thus, a problem of Electro-Static Discharge (ESD) happens more easily during the fabrication process of the array substrate than in the fabrication process of liquid crystal cells and in the module assembly process. As an example, in the fabrication process of the array substrate, when a Plasma Enhanced Chemical Vapor Deposition (PECVD) process is used to form films and a dry etching process is applied, traces on the array substrate can easily accumulate a large amount of electric charges, causing breakdown between adjacent traces to generate a short circuit or a broken circuit, thereby compromising a yield rate of the array substrate.

SUMMARY

Embodiments of the disclosure provide an electro-static discharge (ESD) protection unit. The ESD protection unit includes: a thin-film transistor (TFT); a first trace; and a second trace. A gate electrode of the TFT is exposed in a region that is formed by the first trace and the second trace and corresponds to a pixel unit, and the gate electrode of the TFT is configured to collect electric charges generated between the first trace and the second trace. A source electrode of the TFT is connected to the first trace and a drain electrode of the TFT is connected to the second trace.

Embodiments of the disclosure also provide an array substrate including a plurality of ESD protection units. In each of the ESD protection units, a gate electrode of a respective TFT is connected to a direct current (DC) negative voltage source, and the DC negative voltage source is configured to keep the respective TFT to be switched off when no electro-static discharge occurs.

Embodiments of the disclosure also provide a liquid crystal display panel including the array substrate.

Embodiments of the disclosure also provide a display device including the liquid crystal display panel.

BRIEF DESCRIPTION OF THE DRAWINGS

In order to illustrate the technical solutions in the embodiments of the present disclosure or the existing arts more clearly, the drawings need to be used in the description of the embodiments or the existing arts will be briefly described in the following; it is obvious that the drawings described below are only related to some embodiments of the present disclosure. For one ordinary skilled person in the art, other drawings can be obtained according to these drawings without making additional inventive work.

DETAILED DESCRIPTION

Hereafter, the technical solutions of the embodiments of the present disclosure will be described in a clearly and fully understandable way in connection with the drawings related to the embodiments of the disclosure. It is obvious that the described embodiments are just a part but not all of the embodiments of the present disclosure. Based on embodiments of the present disclosure, all other embodiments obtained by those skilled in the art without making other inventive work should be within the scope of the present disclosure.

In order to solve the problem of ESD, ESD protection units may be disposed between traces of an array substrate, so as to improve a yield rate of the array substrate. In existing ESD protection units, a TFT is generally oppositely connected between adjacent traces having a voltage difference. Alternatively, a structure similar to a lightning rod is introduced between adjacent traces having a voltage difference. Such ESD protection units can have a certain protection effect to some extent. However, as crosstalk should be prevented between adjacent traces having a voltage difference, currents discharged by the ESD protection units are relatively limited even if the ESD protection units are disposed between the adjacent traces having a voltage difference, which may cause a poor protection effect of ESD.

Embodiments of the disclosure provide an ESD protection unit, an array substrate, a liquid crystal display panel and a display device, to solve the problem of poor protection effect of ESD during the fabrication process of the array substrate.

In order to further illustrate the ESD protection unit, the array substrate, the liquid crystal display panel and the display device provided by the embodiments of the disclosure, technical solutions of the embodiments will be described in connection with the drawings.

Figure 1:
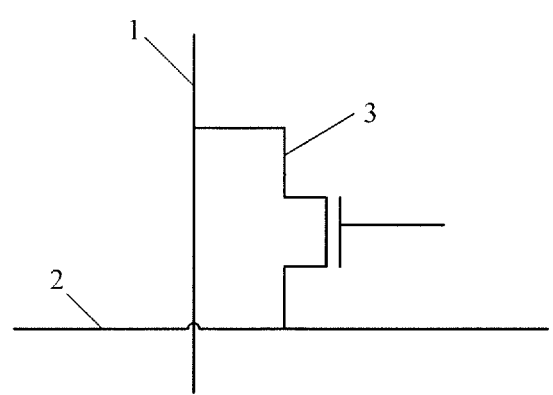
FIG. 1 schematically illustrates an ESD protection unit in accordance with an embodiment of the disclosure.

With reference to FIG. 1, an ESD protection unit provided by an embodiment of the disclosure comprises a TFT 3, a first trace 1 and a second trace 2. There is a voltage difference between the first trace 1 and the second trace 2. A source electrode of the TFT 3 is connected to the first trace 1; a drain electrode of the TFT 3 is connected to the second trace 2; a surface of a gate electrode of the TFT is exposed in a region that is formed by the first trace 1 and the second trace 2 and corresponds to a pixel unit, such that electric charges generated between the first trace 1 and the second trace 2 can be collected by the gate electrode of the TFT 3.

Moreover, the first trace 1 may be a data line or a gate line. Correspondingly, the second trace 2 may be a gate line or a data line. Therefore, the first trace 1 in the embodiments of the disclosure can be a data line and the second trace 2 can be a gate line. Alternatively, the first trace 1 can be a gate line and the second trace 2 can be a data line.

For the convenience of description, operations of ESD protection units in the embodiments of the disclosure will be described in the following with reference to an example ESD protection unit having the first trace 1 as the data line and the second trace 2 as the gate line.

As an example, when ESD occurs between the data line and the gate line, the gate electrode of the TFT 3 absorbs the electric charges generated by the ESD, thereby turning on the TFT 3. At the same time when the TFT 3 is turned on, the TFT 3 collects the electric charges generated by the ESD, thereby discharging a current generated by the ESD between the data line and the gate line.

It can be seen from the above process that the gate electrode of the TFT in the ESD protection unit is exposed in the region that is formed by the data line and the gate line and corresponds to the pixel unit. Thus, when there is no ESD between the data line and the gate line, the TFT 3 is turned off. When ESD occurs between the data line and the gate line, the gate electrode of the TFT 3 can collect the electric charges generated by the ESD, thereby turning on the TFT 3 which is in a switch-off state previously. Thus, the electric charges accumulated between the adjacent traces (i.e., the electric charges accumulated between the data line and the gate line) can be discharged, the voltage difference between the adjacent traces can be reduced and a probability of breakdown between the adjacent traces can be decreased, thereby solving the problem of the poor protection effect of ESD during the fabrication process of the array substrate.

For the purpose of facilitating the gate electrode of the TFT to collect the electric charges generated by the ESD, the TFT may be a top-gate TFT or a bottom-gate TFT. As a gate electrode of a top-gate TFT is on the top, the gate electrode of the top-gate TFT can be exposed more easily than that of a bottom-gate TFT.

Figure 2:
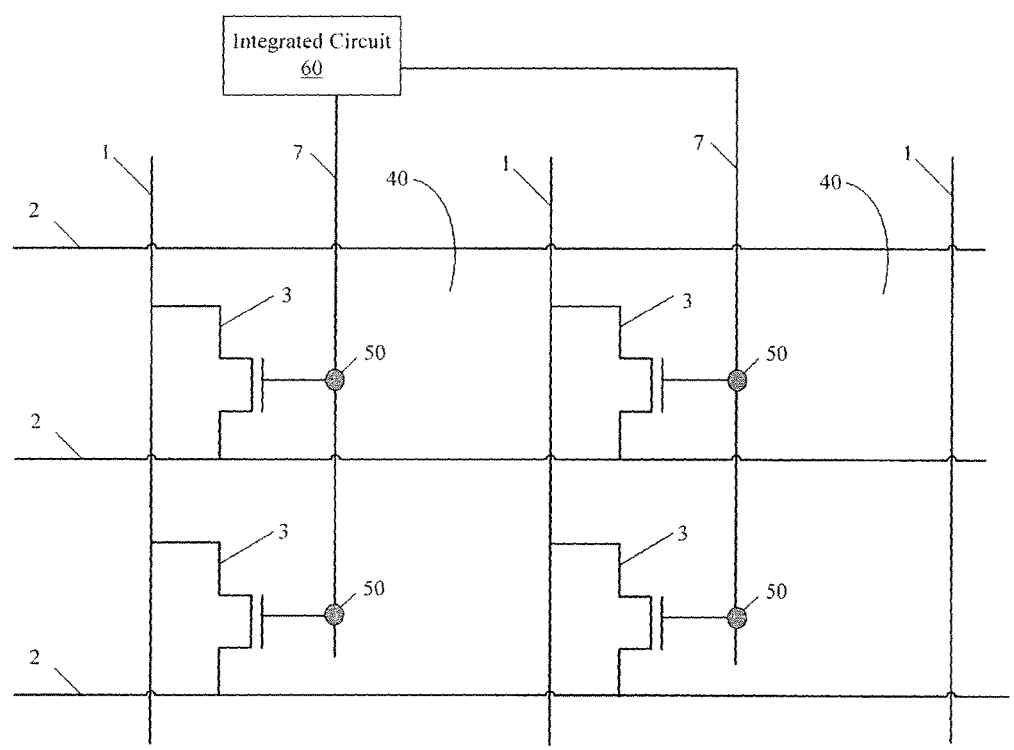
FIG. 2 schematically illustrates an array substrate in accordance with an embodiment of the disclosure.

With reference to FIG. 2, an embodiment of the disclosure further provides an array substrate comprising a plurality of ESD protection units. In each of the ESD protection units, the gate electrode of the TFT is connected to a direct current (DC) negative voltage source 7 which is configured for maintaining the TFT in a turn-off state.

As an example, when there is no ESD between the data line and the gate line, the gate electrode of the TFT 3 controls the TFT 3 to be turned off through a negative voltage provided by the DC negative voltage source 7. When ESD occurs between the data line and the gate line, the gate electrode of the TFT 3 absorbs the electric charges generated by the ESD, causing the TFT 3 to be turned on, thereby collecting the electric charges from the ESD and discharging a current generated by the ESD between the data line and the gate line.

It can be seen from the above process that the gate electrode of the TFT 3 is connected to the DC negative voltage source (for example, the DC negative voltage source is configured for maintaining the TFT at a turn-off state). When there is no ESD, the TFT 3 is turned off, thus preventing occurrence of crosstalk between adjacent signal traces. When ESD occurs between the gate line and the data line, as the gate electrode of the TFT 3 is exposed in a region 40 that is formed by the data line and the gate line and corresponds to the pixel unit, the gate electrode of the TFT 3 can absorb the electric charges generated by the ESD, causing the TFT 3 to be turned on instantly, thereby discharging the current generated by the ESD between the data line and the gate line.

As illustrated in FIG. 2, the first trace 1 (for example a data line) and the second trace 2 (for example a gate line) extend across each other and form a region 40 of a corresponding pixel unit. The gate electrode of the TFT 3 is exposed in the region 40.

To facilitate the connection of the gate electrode of the TFT 3 to the DC negative voltage source, the gate electrode of the TFT 3 in the embodiments is connected to a bonding pad 50 through a semi-conductor trace, and the bonding pad 50 is connected to the DC negative voltage source. The bonding pad 50 may be a bonding pad connected to the DC negative voltage source on the array substrate, or may be a separately-formed bonding pad, as long as the bonding pad can guarantee the connection between the semi-conductor trace and the DC negative voltage source. Moreover, the bonding pad may be a bonding pad with a tear-drop pattern, a polygonal bonding pad or an elliptical bonding pad. As an example, the bonding pad may be a bonding pad with a tear-drop pattern so as to adapt to connection between a relatively thin semi-conductor trace and the DC negative voltage source. Moreover, as relatively thin semi-conductor traces are employed, a weight of the array substrate is reduced correspondingly.

Furthermore, the semi-conductor trace can be an indium tin oxides (ITO) trace. There are many types of semi-conductor traces. No limitation is placed on the types of the semi-conductor traces in the disclosure, as long as they can meet the requirement of conducting current.

Moreover, the DC negative voltage source in the embodiments is provided by an integrated circuit 60 connected to the array substrate. It is possible to employ the integrated circuit 60 that is connected to the array substrate to provide the DC negative voltage source, thereby reducing the cost as there is no need to reconfigure the DC negative voltage source.

An embodiment of the disclosure further provides a liquid crystal display panel comprising the array substrate.

The beneficial effects of the liquid crystal display panel provided by the embodiment are similar to those of the array substrate, which will not be repeated herein.

An embodiment of the disclosure further provides a display device comprising the liquid crystal display panel.

The beneficial effects of the display device provided by the embodiment are similar to those of the array substrate, which will not be repeated herein.

In the above embodiments, specific features, structures, materials or characteristics can be combined in appropriate manners in any one or more embodiments or examples.

In the present disclosure, terms such as "first", "second" and the like used in the present disclosure do not indicate any sequence, quantity or significance but only for distinguishing different constituent parts. Also, the terms such as "a," "an," or "the" etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects.

The foregoing are merely specific embodiments of the disclosure, but not limitative to the protection scope of the disclosure. One skilled in the art could devise variations or replacements that within the scope and the spirit of the present disclosure, those variations or replacements shall belong to the protection scope of the disclosure. Thus, the protection scope of the disclosure shall be defined by the accompanying claims.

The present disclosure claims the benefits of Chinese patent application No. 201510746641.6, which was filed on Nov. 5, 2015 and is incorporated herein in its entirety by reference as part of this application.

What is claimed is:

1. An electro-static discharge (ESD) protection unit, comprising:
   a thin-film transistor (TFT);
   a first trace which is a first one of a gate line and a data line; and a second trace which is a second one of the gate line and the data line;

wherein a source electrode of the TFT is directly connected to the first one of the gate line and the data line, and a drain electrode of the TFT is directly connected to the second one of the gate line and the data line; and wherein a gate electrode of the TFT is exposed in an environment in a region that is formed by the first trace and the second trace and corresponds to a pixel unit, and when an electro-static discharge phenomenon occurs between the first trace and the second trace, the gate electrode of the TFT is configured to collect electric charges accumulated between the first trace and the second trace during the electro-static discharge phenomenon to turn on the TFT so that the first trace is connected to the second trace.

2. The ESD protection unit of claim 1, wherein the TFT is a top-gate TFT.

3. The ESD protection unit of claim 1, wherein the TFT is a bottom-gate TFT.

4. An array substrate comprising a plurality of ESD protection units of claim 1, wherein:

in each of the ESD protection units, a gate electrode of a respective TFT is connected to a direct current (DC) negative voltage source, and the DC negative voltage source is configured to keep the respective TFT to be switched off when no electro-static discharge occurs.

5. The array substrate of claim 4, wherein in each of the ESD protection units, the gate electrode of the respective TFT is connected to a bonding pad through a semi-conductor trace and the bonding pad is connected to the DC negative voltage source.

6. The array substrate of claim 5, wherein the semi-conductor trace is an indium tin oxides (ITO) trace.

7. The array substrate of claim 4, wherein the DC negative voltage source is provided by an integrated circuit connected to the array substrate.

8. A liquid crystal display panel comprising the array substrate of claim 4.

9. A display device comprising the liquid crystal display panel of claim 8.

* * * * *